United States Patent Office 3,297,440
Patented Jan. 10, 1967

3,297,440

PHOTOPOLYMERIZATION OF ETHYLENICALLY UNSATURATED ORGANIC COMPOSITIONS AND THE FORMATION OF A RELIEF IMAGE

Gerard Albert Delzenne, Kessel-Lo, Belgium, assignor to Gevaert Photo-Producten N.V., Mortsel-Antwerp, Belgium, a Belgian company No Drawing. Filed May 2, 1963, Ser. No. 277,460
16 Claims. (Cl. 96—35.1)

The present invention relates to the photopolymerization of ethylenically unsaturated organic compositions and to polymers obtained therefrom.

The photopolymerization of ethylenically unsaturated organic compositions can be initiated by exposure to high intensity radiation such as ultra-violet rays. Methylacrylate, for instance, on long standing in sun light is transformed into a transparent mass (cf. Ellis: The Chemistry of Synthetic Resins, Vol. II (1935), page 1072). Polymerization, however, by the use of light alone, proceeds at a very much slower rate when compared to polymerization brought about by a radical generating catalyst or by heat. Moreover, the use of light alone, unaided by other agents, requires very long exposure times in order to polymerize the monomer sufficiently. Furthermore, the low rate of polymerization necessitates the use of extremely intense radiations such as those obtained from high intensity carbon arcs.

A lot of photopolymerization initiators which, under the influence of actinic light, increase the photopolymerization rate, have already been described. A survey of such photopolymerization initiators has been given by G. Delzenne in "Industrie Chimique Belge, 24 (1959), 739–764."

An object of the present invention is to provide a new class of photopolymerization initiators activatable by actinic light.

Another object of the present invention is to provide a new class of photopolymerization initiators which require very low rates of exposition to actinic light.

A further object is to provide a process whereby the photopolymerization of ethylenically unsaturated organic compositions can be carried out at a practicable rate by visible light as well as by ultra-violet light.

Other objects will appear hereinafter.

According to the present invention the photopolymerization of ethylenically unsaturated organic compositions is improved by exposing said ethylenically unsaturated organic compositions to actinic light rays in the presence as a photopolymerization initiator of cobalt (III)-ammine complexes.

The quantity of cobalt (III)-ammine complexes to be used as photopolymerization initiator will of course be dependent upon many variables including the particular cobalt (III)-ammine complex, the wave length of light employed, the irradiation time, the monomer or monomers present, the temperature, the quantity and type of solvents present, etc. Usually the amount of cobalt (III)-ammine complex used as photopolymerization initiator is very small, within the range of 0.01 to 5% by weight based upon the amount of monomeric material initially present. It is seldom necessary to employ more than 0.2 to 2% by weight to obtain a good polymerization rate.

The ethylenically unsaturated organic compositions may be exposed to actinic light from any source and of any type. The light source should, preferably although not necessarily, furnish an effective amount of ultra-violet radiation. Suitable sources of light include carbon arcs, mercury-vapor lamps, fluorescent lamps, argon glow lamps, photographic flood lamps and tungsten lamps. Moreover, with the cobalt (III)-ammine complexes of the invention, ordinary day light may also be used.

For initiating the photopolymerization by means of the photopolymerization initiators according to the invention a very strong light source is not needed. Indeed, in most of the examples described hereinafter a 80 Watt Philips mercury-vapor lamp, placed at a distance of about 15 cm. of the surface to be polymerized, is used. Brighter light sources are generally not needed since at these relatively low light intensities the photo-initiating influence of the cobalt (III)-ammine complexes according to the invention is found to be strong enough.

The photopolymerization can be carried out by any of the well-known processes, such as bulk, emulsion, suspension and solution polymerization processes. In all of these processes, the addition of a cobalt (III)-ammine complex according to the invention to polymerizable materials subjected to the action of actinic light greatly increases the rate of photopolymerization.

A suitable base or support may be coated with a solution of the ethylenically unsaturated organic composition in a suitable solvent, this solution containing dissolved or homogeneously dispersed therein, a photopolymerization initiating cobalt (III)-ammine complex, whereupon the solvent or solvent mixture is eliminated by known means such as evaporation, leaving a more or less thin coating of the ethylenically unsaturated organic composition upon the base or support. Thereafter the dried photopolymerizable coating is exposed to actinic light rays.

When exposing the photopolymerizable composition to actinic light rays the polymerization does not start immediately. It is only after a short period, which among others depends on the ethylenically unsaturated organic composition, the photopolymerization initiator and the light intensity used, that the photopolymerization starts. The period necessary for obtaining a perceptible polymerizate is a measure for the efficiency of the photopolymerization initiator. In the further description and examples said period is referred to as the "inhibition period."

In some circumstances it may be desirable that the photopolymerizable composition comprises a hydrophilic or hydrophobic colloid as carrier or binding agent for the ethylenically unsaturated organic composition and the photopolymerization initiating cobalt (III)-ammine complex. By the presence of this binding agent the properties of the light-sensitive layer are of course highly affected. The choice of the binding agent is dependent on its solubility in solvents which can also be used as solvents for the ethylenically unsaturated organic compounds and for the cobalt (III)-ammine complex of the invention. Suited binding agents are for instance poly(styrene), poly(methylmethacrylate), poly(vinylacetate), poly(vinylbutyral), partially saponified cellulose acetate and other polymers soluble in organic solvents. In some instances water-soluble polymers can be used such as gelatin, casein, starch, carboxymethyl cellulose, poly(vinylalcohol) and others. It is evident that the ratio photopolymerizable composition/binding agent also influences the photopolymerization. The larger this ratio, the higher the photopolymerization rate generally will be for one and the same ethylenically unsaturated organic composition.

If the photopolymerizable composition is water-soluble water may be used as solvent in coating the support. On the contrary, if water-insoluble photopolymerizable compositions are used, organic solvents, mixtures of organic solvents or mixtures of organic solvents and water may be used.

When the photopolymerizable compounds are crystallizable it is found that the photopolymerization is surprisingly more effective when the photopolymerizable compounds present in the coated layer are in the crystalline state.

Cobalt (III)-ammine complexes suitable for being applied as photopolymerization initiators are for instance:

ammonium dioxolato diammine-cobaltate $$[Co(C_2O_4)_2(NH_3)_2]NH_4 \cdot H_2O$$

potassium tetranitro diammine-cobaltate $$[Co(NH_3)_2(NO_2)_4]K$$

trinitro-triammine cobalt (III)

$$[Co(NH_3)_3(NO_2)_3]$$

dinitro-tetrammine cobalt (III)-nitrate $$[Co(NH_3)_4(NO_2)_2]NO_3$$

carbonato-tetrammine cobalt (III)-nitrate $$[Co(NH_3)_4CO_3]NO_3$$

chloro-pentammine cobalt (III)-dichloride $$[Co(NH_3)_5Cl]Cl_2$$

nitro-pentammine cobalt (III)-dinitrate $$[Co(NH_3)_5NO_2](NO_3)_2$$

In addition to the above non-limiting list of compounds there still exist whole series of cobalt (III)-ammine complexes suitable for being used as photopolymerization initiator provided they satisfy the definitions given in the objects of invention.

Suitable are cobalt (III)-ammine complexes which correspond to one of the following general formulae:

$$[CoAm_mR_n]^{(3-n)+} \cdot (3-n)X^-$$

$$[CoAm_3R_3] \text{ and}$$

$$[CoAm_pR_q]^{(q-3)-} \cdot (q-3)M^+$$

wherein:

Am stands for an ammino group, which ammino group is selected from neutral monofunctional and polyfunctional ligands such as ammonia, pyridine, ethylene diamine, $\alpha,\alpha'$-dipyridyl, $\alpha$, $\beta$, $\gamma$-triaminopropane, $\beta$, $\beta'$, $\beta''$-triaminotriethylamine and the like;

R is selected from the group consisting of univalent acidic groups and the equivalent amount of multivalent acidic groups such as chloride, bromide, nitrate, nitrite, carbonate, hydroxyl and the like;

X is selected from the group consisting of any not-bound univalent acidic group and the equivalent amount of multivalent acidic groups such as chloride, bromide, nitrate, nitrite, carbonate, hydroxyl and the like;

M is selected from the group consisting of ammonium, monovalent positive metal ions and equivalent amounts of multivalent positive metal ions, such as sodium, potassium, calcium and the like;

$m$ is selected from 4, 5 and 6;

$n$ is selected from 0, 1 and 2, with the provision that $m+n=6$;

$p$ is selected from 1 and 2; and $q$ is selected from 5 and 4 with the provision that $p+q=6$.

Of particular importance are also cobalt (III)-ammine-aquo complexes such as dichloro-aquo-triammine cobalt (III)-chloride $$[Co(NH_3)_3(H_2O)Cl_2]Cl$$

and aquo-pentammine cobalt (III)-trinitrate $$[Co(NH_3)_5(H_2O)](NO_3)_3$$

These cobalt (III)-ammino-aquo complexes are obtained when in the above given 3 general formulae of cobalt (III)-ammine complexes at least part of the acidic group R is replaced by water and when the global charge distribution in these formulae is corrected accordingly.

In the same manner polynuclear cobalt (III)-ammine complexes may be used such as for instance bis[carbonato tetrammine cobalt (III)]sulphate $$[Co(NH_3)_4(CO_3)]_2 \cdot SO_4 \cdot 3H_2O$$

In addition there are a number of polynuclear ammine complexes in which hydroxo ($OH^-$), peroxo ($O_2^{2-}$), amido ($NH_2^-$) and imido ($NH^{2-}$) groups function as bridges which can be used as photopolymerization initiators according to the invention. Examples of these complexes are trichloroaquohexammine - $\mu$ - amidodicobalt (III)-chloride, dodecamminehexoltetracobalt (III)-chloride.

Occasionally one of the above cobalt (III)-ammine complexes can be attached to a polymeric chain via an acidic group or via a suitable ligand.

A survey of cobalt (III)-ammine complexes can be found in "Treatise on Inorganic Chemistry," H. Remy, Elsevier Publishing Company, 1956, Vol. II, pages 304–306.

The cobalt (III)-ammine complexes can be directly mixed with the photopolymerizable composition.

It is evident that also combinations of two or more cobalt (III)-ammine complexes may be applied as photopolymerization initiator in the photopolymerization of particular monomers.

The process of the invention may be applied to the photopolymerization of ethylenically unsaturated organic compositions. These compositions may comprise one or more ethylenically unsaturated polymerizable compounds such as acrylamide, methacrylamide, N-methylol-acrylamide, acrylonitrile, acrylic acid, methacrylic acid, calcium acrylate, vinyl carbazole, vinyl phthalimide, etc. When two of these monomers are used in the same photopolymerizable composition or if they are mixed with other polymerizable compounds, copolymers are formed during the photopolymerization. It is further suspected that in the case where the photopolymerizable material is used together with a polymeric binding agent, graft copolymers are formed between the polymeric binder and the photopolymerized material.

The ethylenically unsaturated organic composition may also comprise or consist of unsaturated compounds having more than one carbon-to-carbon double bond, e.g. two terminal vinyl groups, or of a polymeric compound containing ethylenically unsaturation. During polymerization of these compositions usually crosslinking by means of the plurality unsaturated compound will occur. Examples of compounds containing more than one carbon-to-carbon double bond are for instance divinyl benzene, diglycol diacrylates and N,N'-alkylene-bis-acrylamides. Examples of polymeric compounds containing ethylenically unsaturation are for instance allyl esters of polyacrylic acid, maleic esters of polyvinyl alcohol, polyhydrocarbons still containing carbon-to-carbon double bonds, unsaturated polyesters, cellulose acetomaleates, allylcellulose, and the like.

In the photopolymerization of ethylenically unsaturated compounds with cobalt (III)-ammine complexes high temperatures are not needed. The exposure, however, to strong light sources at a relatively short distance, brings about a certain heating of the mass to be polymerized, which heating exercises a favorable influence upon the polymerization rate.

The photopolymerizable compositions which contain cobalt (III)-ammine complexes are useful in the preparation of photographic images.

These photographic polymeric images are manufactured by exposing a photopolymerizable layer to actinic light through a process transparency, e.g. a process positive or negative (consisting solely of opaque and transparent areas and where the opaque areas are of the same optical density, the so-called line or halftone negative or positive). After complete polymerization in the exposed areas whereby the polymeric layer is rendered insoluble in the solvent or solvents used for applying the photopolymerizable layer, the non-exposed areas are washed off with a solvent for the monomeric material.

Usually a polymerization inhibitor is added to the composition of the photopolymerizable layer in order to prevent thermal polymerization, and to make the materials capable of being stocked for a longer time. All known radical inhibitors may be used for this purpose, for example, 2,6-di-tert.butyl-p-cresol.

The photopolymerizable composition is usually coated onto a support such as paper, cellulose triacetate films, poly(ethylene terephthalate) films, aluminum foils and the like. When this support material carrying the photopolymerizable composition is light-reflecting, there may be present, e.g. superposed on said support and adherent thereto or in the surface thereof, a layer or stratum absorptive of actinic light such as to minimize reflectance from the combined support of incident actinic light. The photographic polymeric images made in accordance with this invention can be used in all classes of printing, but are particularly useful in those wherein a distinct difference of height between printing and non-printing areas is required. The photopolymerizable compositions are also useful in the preparation of photoresists for etching, gravure, etc.; they can be used for the manufacture of planographic printing plates such as for offset printing methods, as matrices for printing matter, and as screens for "silk screen" printing such as stencils. The compositions can be coated onto printing cylinders, e.g. plastic or metal cylinders.

The photopolymerizable layer may vary from liquid to solid composition, it may even be in gel form.

The solvent liquid used for washing or "developing" the printing plates made from photopolymerizable compositions must be selected with care, since it should have good solvent action on the unexposed monomeric material, yet have little action on the hardened image or upon the base material, the non-halation layer, or the anchor layer with which the photopolymerizable composition may be anchored to the support.

The photopolymerizable compositions are suitable for other purposes in addition to the printing uses described above, e.g. as ornamental plaques or for producing ornamental effects; as patterns for automatic engraving machines, foundry molds, cutting and stamping dies, name stamps; relief maps for braille; as rapid cure coatings, e.g. on film base; as variable area and variable density sound tracks on film; for embossing plates, paper, e.g. with a die prepared from the photopolymerizable compositions; in the preparation of printed circuits, and in the preparation of other plastic articles.

The photopolymerization initiators of the invention can be used as an ultra-violet curing catalyst for systems where low heat is a requirement in the curing of a particular part, and sunlight or other source of ultra-violet light are readily available. Unsaturated polyester coated bridge or other surfaces, roofs and other outdoor coating applications are areas where the cobalt (III)-ammine complexes of the invention can be advantageously employed.

The following examples illustrate the present invention.

EXAMPLE 1

In a Pyrex reactor an aqueous solution of 30% by weight of acrylamide (4.2 mol/litre) and 0.25% by weight ($8 \times 10^{-3}$ mol/litre) of nitro-pentammine cobalt (III)-dinitrate, $[Co(NH_3)_5NO_2](NO_3)_2$, is illuminated by means of a 80 watt high pressure mercury vapor lamp placed at a distance of 5 cm. and in the presence of atmospheric oxygen. The polymerization is clearly perceptible after an exposure time of 10 min. and the reaction is complete after 20 min.

A same solution is analogeously exposed to a 300 watt ordinary light source radiating wavelengths between 4000 and 7000 A. In this case an irradiation time of 60 min. is necessary for making the polymerization reaction proceed completely.

EXAMPLE 2

In a Pyrex reactor an aqueous solution of 30% by weight of acrylamide (4.2 mol/litre) and 0.25% by weight ($10.6 \times 10^{-3}$ mol/litre) of dichloro-aquo-triammine cobalt (III) chloride, $[Co(NH_3)_3(H_2O)Cl_2]Cl$, is illuminated by means of a 80 watt high pressure mercury vapor lamp placed at a distance of 5 cm. and in the presence of atmospheric oxygen. The polymerization is clearly perceptible after an exposure time of 15 min. and the reaction is complete after 25 min.

When irradiating by means of a 300 watt ordinary lamp, radiating wavelengths between 4000 and 7000 A., the same exposure times are required.

EXAMPLE 3

In a Pyrex reactor an aqueous solution of 30% by weight of acrylamide (4.2 mol/litre) and 0.25% by weight ($7.2 \times 10^{-3}$ mol/litre) of aquo-pentammine cobalt (III)-trinitrate, $[Co(NH_3)_5(H_2O)](NO_3)_3$, is illuminated by means of a 80 watt high pressure mercury vapor lamp, placed at a distance of 5 cm. and in the presence of atmospheric oxygen. The polymerization is clearly perceptible after an irradiation time of 8 min. and the reaction is complete after 15 min.

The irradiation times can be reduced to 2 min. (perceptible polymerization) and 10 min. (complete reaction) when carrying out the reaction under nitrogen atmosphere. When irradiating with visible light, in the presence of atmospheric oxygen the exposure times are resp. 40 and 60 min.

EXAMPLE 4

In a Pyrex reactor an aqueous solution of 30% by weight of acrylamide (4.2 mol/litre) and 0.25% by weight ($10.1 \times 10^{-3}$ mol/litre) of trinitro-triammine cobalt (III), $[Co(NH_3)_3(NO_2)_3]$, is illuminated by means of a 80 watt high pressure mercury vapor lamp, placed at a distance of 5 cm. and in the presence of atmospheric oxygen. The polymerization is clearly perceptible after 8 min. of irradiation and the reaction is complete after 15 min.

The irradiation times can be reduced to 2 min. (perceptible polymerization) and 14 min. (complete reaction) when carrying out the reaction under nitrogen atmosphere.

A same solution is analogeously illuminated by means of a 300 watt ordinary lamp radiating wavelengths between 4000 and 7000 A. In this case the irradiation times are very favorable. In the presence of atmospheric oxygen the polymerization is perceptible after 12 min. and the reaction is complete after 18 min.

EXAMPLE 5

In a Pyrex reactor an aqueous solution of 30% by weight of acrylamide (4.2 mol/litre) and 0.21% by weight ($10^{-2}$ mol/litre) of chloro-pentammine cobalt (III)-dichloride, $[Co(NH_3)_5Cl]Cl_2$, is illuminated by means of a 500 watt high pressure mercury vapor lamp, placed at a distance of 25 cm. and in the presence of atmospheric oxygen. The polymerization is complete after 15 min. of irradiation.

EXAMPLE 6

In a Pyrex reactor an aqueous solution of 30% by weight of acrylamide (4.2 mol/litre) and 0.25% by weight ($8.9 \times 10^{-3}$ mol/litre) of dinitro-tetrammine cobalt (III)-nitrate, $[Co(NH_3)_4(NO_2)_2]NO_3$, is illuminated by means of a 500 watt high pressure mercury vapor lamp, placed at a distance of 25 cm. and in the presence of atmospheric oxygen. The polymerization is complete after an irradiation time of 35 min.

EXAMPLE 7

In a Pyrex reactor an aqueous solution of 30% by weight of acrylamide (4.2 mol/litre) and 0.25% by weight ($10^{-2}$ mol/litre) of carbonato-tetrammine cobalt (III)-nitrate, $[Co(NH_3)_4CO_3]NO_3$, is illuminated by means of a 500 watt high pressure mercury vapor lamp placed at a distance of 25 cm. in the presence of atmospheric oxygen. The polymerization is complete after an irradiation time of 35 min.

EXAMPLE 8

In a Pyrex reactor an aqueous solution of 30% by weight of acrylamide (4.2 mol/litre) and 0.25% by weight ($5.08 \times 10^{-3}$ mol/litre) of bis[carbonato-tetrammine cobalt (III)]sulphate, $$[Co(NH_3)_4(CO_3)]_2SO_4 \cdot 3H_2O$$

is illuminated by means of an 80 watt high pressure mercury vapor lamp, placed at a distance of 5 cm. in the presence of atmospheric oxygen. The polymerization is clearly perceptible after an irradiation time of 15 min. and the reaction is complete after 30 min.

Visible light (wavelengths between 4000 and 7000 A.) may also be used and in that case, the polymerization is perceptible after an irradiation time of 90 min.

EXAMPLE 9

In a Pyrex reactor an aqueous solution of 30% by weight of acrylamide (4.2 mol/litre) and 0.25% by weight ($8.2 \times 10^{-3}$ mol/litre) of ammonium dioxolato-diammino cobaltate, $[Co(C_2O_4)_2(NH_3)_2]NH_4 \cdot H_2O$, is illuminated by means of an 80 watt high pressure mercury vapor lamp, placed at a distance of 5 cm. in the presence of atmospheric oxygen. The polymerization is clearly perceptible after an irradiation time of 14 min. and the reaction is complete after 25 min.

EXAMPLE 10

In a Pyrex reactor an aqueous solution of 30% by weight of acrylamide (4.2 mol/litre) and 0.25% by weight ($7.9 \times 10^{-3}$ mol/litre) of potassium tetranitro diammine cobaltate, $[Co(NH_3)_2(NO_2)_4]K$, is illuminated by means of an 80 watt high pressure mercury vapor lamp placed at a distance of 5 cm. in the presence of atmospheric oxygen. The polymerization is clearly perceptible after an irradiation time of 15 min. The reaction is complete after 120 min. of irradiation.

EXAMPLE 11

A cellulose triacetate film having a thickness of 0.125 mm. is coated with an aqueous solution containing 15% by weight of gelatin, 30% by weight of acrylamide, 3% by weight of N,N'-methylene bis-acrylamide and 6% by weight of trinitro-triammine cobalt (III), $$[Co(NH_3)_3(NO_2)_3]$$

A process transparency is laid upon the light-sensitive layer, having a thickness of about 25$\mu$, whereupon the whole (process transparency, light-sensitive layer and support) is pressed between two glass plates and then illuminated in the presence of atmospheric oxygen by means of an 80 watt high pressure mercury vapor lamp, placed at a distance of 5 cm. After 5 min. the light source and the process transparency are removed. The light-sensitive layer is developed in water of about 40° C. After drying a sharp relief image is obtained.

EXAMPLE 12

A cellulose triacetate film having a thickness of 0.125 mm. is coated with an aqueous solution containing 15% by weight of gelatin, 12% by weight of acrylamide, 1.2% by weight of N,N'-methylene-bis-acrylamide and 6.75% by weight of ammonium dioxolato-diammine cobaltate, $[Co(C_2O_4)_2(NH_3)_2]NH_4 \cdot H_2O$.

A process transparency is laid upon the light-sensitive layer of about 25$\mu$ thickness, whereupon the layer is exposed through the process transparency by means of an 80 watt high pressure mercury vapor lamp, placed at a distance of 5 cm. After 2 min. of irradiation an image is formed. After 5 min. the light-sensitive layer is developed in water of about 40° C. and a sharp relief image is obtained.

EXAMPLE 13

To a solution 1.1 g. of gelatin in 5 cm.$^3$ of water the following solutions A and B are added:

*Solution A*

1.8 g. of acrylamide
0.2 g. of N,N'-methylene bis-acrylamide
1.2 cm.$^3$ of water

*Solution B*

0.5 g. of ammonium dioxolato diammine cobaltate $$[Co(C_2O_4)_2(NH_3)_2]NH_4 \cdot H_2O$$

0.01 g. of sodium lauryl sulfate
5 cm.$^3$ of water

The photo-sensitive solution thus obtained is coated onto a cellulose triacetate film.

A process transparency is laid upon the light-sensitive layer of about 15$\mu$ thickness, whereupon it is irradiated by means of an 80 watt high pressure mercury vapor lamp, placed at a distance of 5 cm. A good relief image is obtained after 2 min. of irradition by development in water of about 40° C.

EXAMPLE 14

To a solution of 1 g. of gelatin in 20 cm.$^3$ of water the following solution is added:

1 g. of acrylamide
0.1 g. of N,N'-methylene bis-acrylamide
0.01 g. of nitro-pentammine-cobalt (III)-dinitrate.

From this solution a layer of 0.150 mm. thickness is coated onto a polyethylene terephthalate film. After drying, a process transparency is laid upon the light-sensitive layer of 15$\mu$ thickness, whereupon it is irradiated by means of an 80 watt high pressure mercury vapor lamp, placed at a distance of 5 cm. A good relief image is obtained after 5 min. of irradiation by development in water of about 40° C.

I claim:

1. Process for the photopolymerization of ethylenically unsaturated organic compositions, which comprises exposing said ethylenically unsaturated organic compositions to actinic light rays in the presence as a photopolymerization initiator of a cobalt (III)-ammine complex.

2. A process as set forth in claim 1, wherein the cobalt (III)-ammine complexes correspond to one of the formulae:

$$[CoAm_mR_n]^{(3-n)+} \cdot (3-n)X^-$$
$$[CoAm_3R_3] \text{ and}$$
$$[CoAm_pR_q]^{(q-3)-} \cdot (q-3)M^+$$

wherein:

Am is an ammino group selected from neutral monofunctional and polyfunctional ligands such as ammonia, pyridine, ethylene diamine, $\alpha,\alpha'$-dipyridyl, $\alpha,\beta,\gamma$-triaminopropane and $\beta,\beta',\beta''$-triaminotriethylamine;

R is selected from the group consisting of univalent acidic groups and the equivalent amount of multivalent acidic groups such chloride, bromide, nitrate, nitrite, carbonate, hydroxyl;

X is selected from the group consisting of any not-bound univalent acidic group and the equivalent amount of multivalent acidic groups such as chloride, bromide, nitrate, nitrite, carbonate, and hydroxyl;

M is selected from the group consisting of ammonium, monovalent positive metal ions and equivalent amounts of multivalent positive metal ions, such as sodium, potassium, calcium and the like;

*m* is selected from 4, 5 and 6;

*n* is selected from 0, 1 and 2, with the provision that $m+n=6$;

*p* is selected from 1 and 2;

*q* is selected from 5 and 4, with the provision that $p+q=6$.

3. A process as set forth in claim 1, wherein the cobalt (III)-ammine complex is a cobalt (III)-ammine-aquo complex.

4. A process as set forth in claim 3, wherein the cobalt (III)-ammine-aquo complex is dichloro-aquo-triammine cobalt (III)-chloride.

5. A process as set forth in claim 3, wherein the cobalt (III)-ammine-aquo complex is aquo-pentammine cobalt (III)-trinitrate.

6. A process as set forth in claim 1, wherein the cobalt (III)-ammine complex is a polynuclear cobalt (III)-ammine complex.

7. A process as set forth in claim 1, wherein the ethylenically unsaturated organic composition comprises at least one ethylenically unsaturated polymerizable compound mixed with a polymeric binding agent.

8. A process as set forth in claim 1, wherein the ethylenically unsaturated composition comprises at least one unsaturated compound having more than one carbon-to-carbon double bond.

9. A process as set forth in claim 1, wherein the ethylenically unsaturated composition comprises a polymeric compound containing ethylenic unsaturation.

10. A process as set forth in claim 1, wherein the cobalt (III)-ammine complex is used in an amount between 0.01 and 5% by weight based upon the amount of photopolymerizable material present.

11. A process as set forth in claim 1, wherein the ethylenically unsaturated composition is polymerized in solution.

12. A process as set forth in claim 1, wherein the ethylenically unsaturated composition is applied as a coating on a support.

13. A process as set forth in claim 1, wherein the ethylenically unsaturated composition is present in the crystalline state.

14. A process for producing a polymeric photographic image, which comprises exposing to actinic light rays through a process transparency a photographic element comprising a support having thereon a light-sensitive layer comprising an ethylenically unsaturated organic composition and as photopolymerization initiator at least one cobalt (III)-ammine complex whereby in the exposed areas said ethylenically unsaturated organic composition is polymerized to an insoluble state, and removing the layer in the non-exposed areas.

15. A photopolymerizable element comprising a support and superposed thereon a light-sensitive layer comprising an ethylenically unsaturated organic composition and as photopolymerization initiator at least one cobalt (III)-ammine complex.

16. A photopolymerizable element as set forth in claim 15, wherein the support is selected from paper, cellulose triacetate films, poly(ethylene terephthalate) films and aluminum foils.

References Cited by the Examiner

UNITED STATES PATENTS 2,972,540 2/1961 Saner et al. ............ 96—115

OTHER REFERENCES

Adamison, A.W., "Photochemical Oxidation-Reduction Reactions of Some Transition Metal Complexes," Discussions of the Faraday Society, No. 29, 1960, pages 163–168.

Klein et al., "The Photochemical Decomposition of the Halides of Tris-(ethylenediamine)-Cobalt (III) in the Solids State," Journal of the American Chemical Society, vol. 80, 1958, pages 265–269.

Linhard et al., "Lichtabsorption von Nitro-Kobalt-Amminen," Z anorg. allgem. Chemie, 1852, pages 113–130, BD267.

NORMAN G. TORCHIN, *Primary Examiner.*

T. J. HOFFMAN, R. H. SMITH, *Assistant Examiners.*